US012757803B2

(12) United States Patent
Oh et al.

(10) Patent No.: US 12,757,803 B2
(45) Date of Patent: Oct. 6, 2026

(54) SEMICONDUCTOR PACKAGES HAVING DUMMY POSTS

(71) Applicant: SAMSUNG ELECTRONICS CO., LTD., Suwon-si (KR)

(72) Inventors: Sanghyuck Oh, Suwon-si (KR); Seonghoon Bae, Suwon-si (KR); Kwangok Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 614 days.

(21) Appl. No.: 18/216,157

(22) Filed: Jun. 29, 2023

(65) Prior Publication Data

US 2024/0162127 A1 May 16, 2024

(30) Foreign Application Priority Data

Nov. 16, 2022 (KR) ........................ 10-2022-0153453
Dec. 16, 2022 (KR) ........................ 10-2022-0176529

(51) Int. Cl.

| | |
|---|---|
| ***H10W 10/17*** | (2026.01) |
| ***H10W 70/685*** | (2026.01) |
| ***H10W 74/10*** | (2026.01) |
| ***H10W 90/00*** | (2026.01) |
| *H10B 80/00* | (2023.01) |
| *H10W 74/15* | (2026.01) |

(52) U.S. Cl.

CPC ....... *H10W 90/701* (2026.01); *H10W 70/685* (2026.01); *H10W 74/117* (2026.01); *H10B 80/00* (2023.02); *H10W 74/15* (2026.01); *H10W 90/00* (2026.01); *H10W 90/724* (2026.01); *H10W 90/734* (2026.01); *H10W 90/754* (2026.01)

(58) Field of Classification Search

CPC ............ H10W 90/701; H10W 70/685; H10W 74/117; H10W 74/15; H10W 90/00; H10W 90/724; H10W 90/734; H10W 90/754; H10B 80/00; H01L 23/3128; H01L 24/73; H01L 25/105; H01L 23/49811; H01L 23/49822; H01L 23/5389; H01L 24/16; H01L 24/20; H01L 2225/1058; H01L 23/49816; H10P 72/7424; H10P 72/743; H10P 72/74

USPC .......................................................... 257/668

See application file for complete search history.

(56) References Cited

U.S. PATENT DOCUMENTS

| | | | |
|---|---|---|---|
| 8,129,840 | B2 | 3/2012 | Jo et al. |
| 9,318,442 | B1 | 4/2016 | Chen |
| 9,324,557 | B2 | 4/2016 | Cate et al. |
| 9,881,908 | B2 | 1/2018 | Lin et al. |

(Continued)

*Primary Examiner* — Theresa T Doan

(74) *Attorney, Agent, or Firm* — Sughrue Mion, PLLC

(57) ABSTRACT

A semiconductor package according to an example embodiment of the present disclosure comprises: a lower redistribution structure including an insulating layer, a connection pad disposed on an upper surface of the insulating layer, and an upper pad; a semiconductor chip mounted on the lower redistribution structure and connected to the upper pad; a conductive post disposed on the connection pad; at least one dummy post disposed on the lower redistribution structure; and an upper redistribution structure disposed on the semiconductor chip and connected to the conductive post, and a height of the at least one dummy post is smaller than a height of the conductive post.

19 Claims, 18 Drawing Sheets

(56) References Cited

U.S. PATENT DOCUMENTS

| | | | |
|---|---|---|---|
| 9,960,137 B1 | 5/2018 | Huang et al. | |
| 10,032,738 B2 | 7/2018 | Park et al. | |
| 10,354,982 B2 | 7/2019 | Tsai et al. | |
| 10,867,919 B2 | 12/2020 | Tsai et al. | |
| 2014/0252646 A1 | 9/2014 | Hung et al. | |
| 2016/0307862 A1 | 10/2016 | Lin et al. | |
| 2020/0343223 A1* | 10/2020 | Chen | H01L 21/6835 |

* cited by examiner

SEMICONDUCTOR PACKAGES HAVING DUMMY POSTS

CROSS-REFERENCE TO RELATED APPLICATION(S)

This application claims benefit of priority to Korean Patent Application Nos. 10-2022-0153453 and 10-2022-0176529 filed on Nov. 16, 2022, and Dec. 16, 2022, respectively, in the Korean Intellectual Property Office, the disclosures of which are incorporated herein by reference in their entirety.

BACKGROUND

1. Field

The present disclosure relates to semiconductor packages having dummy posts.

2. Description of Related Art

With an increase in demand for high performance, high speed, and/or multifunctionalization of semiconductor devices, integration of semiconductor devices is increasing. In manufacturing semiconductor devices with a fine pattern corresponding to the tendency for high integration in semiconductor devices, it is required to implement patterns having a fine width or a fine separation distance. In addition, high integration of semiconductor devices mounted on semiconductor packages is required.

SUMMARY

An aspect of the present disclosure is to provide semiconductor packages with a dummy post formed to be lower than a conductive post.

According to an aspect of the disclosure, a semiconductor package includes: a lower redistribution structure comprising an insulating layer, a connection pad and an upper pad, wherein the connection pad and the upper pad are disposed on an upper surface of the insulating layer; a semiconductor chip mounted on the lower redistribution structure and connected to the upper pad; a conductive post disposed on the connection pad; at least one dummy post disposed on the lower redistribution structure; and an upper redistribution structure disposed on the semiconductor chip and connected to the conductive post, wherein a height of the at least one dummy post is less than a height of the conductive post.

An upper surface of the at least one dummy post may be disposed at a lower level than an upper surface of the conductive post.

A difference between the height of the at least one dummy post and the height of the conductive post may be within a range of 10 μm to 15 μm.

A horizontal width of the at least one dummy post may be greater than a horizontal width of the conductive post.

A difference between the horizontal width of the at least one dummy post and the horizontal width of the conductive post may be within a range of 20 μm to 50 μm.

The at least one dummy post may be disposed in a center region of the lower redistribution structure adjacent to the semiconductor chip.

A lower surface of the at least one dummy post may be in direct contact with the insulating layer.

The at least one dummy post may include a body portion disposed on an upper surface of the lower redistribution structure and a protrusion protruding downward from a lower surface of the body portion.

The protrusion may be embedded in the insulating layer.

The at least one dummy post may include a first dummy post and a second dummy post, and a distance between the first dummy post and the semiconductor chip may be less than a distance between the second dummy post and the semiconductor chip, and a height of the first dummy post may be greater than a height of the second dummy post.

The lower redistribution structure may further include a via disposed below the connection pad, the first dummy post may include a first protrusion having a horizontal width greater than a horizontal width of the via, and the second dummy post may include a second protrusion having a horizontal width greater than the horizontal width of the via.

The first dummy post may include a first protrusion and the second dummy post may include a second protrusion, and a horizontal width of the first protrusion may be greater than a horizontal width of the second protrusion.

The at least one dummy post may include a third dummy post, and the third dummy post may include a plurality of protrusions.

The at least one dummy post may not be electrically connected to the lower redistribution structure and the upper redistribution structure.

The semiconductor package may further include: an encapsulant disposed between the lower redistribution structure and the upper redistribution structure and configured to cover the semiconductor chip, wherein an upper surface of the conductive post is coplanar with an upper surface of the encapsulant, and an upper surface of the at least one dummy post is covered by the encapsulant.

According to an aspect of the disclosure, a semiconductor package includes: a lower redistribution structure including an insulating layer, a connection pad and an upper pad, wherein the connection pad and the upper pad are disposed on an upper surface of the insulating layer; a semiconductor chip mounted on the lower redistribution structure and connected to the upper pad; a conductive post disposed on the connection pad; at least one center dummy post disposed in a center region of the lower redistribution structure; at least one edge dummy post disposed in an edge region of the lower redistribution structure; and an upper redistribution structure disposed on the semiconductor chip and connected to the conductive post, wherein a height of the at least one center dummy post is less than a height of the conductive post, and an upper surface of the at least one center dummy post is spaced apart from the upper redistribution structure.

Horizontal widths of the at least one center dummy post and the at least one edge dummy post may be greater than a horizontal width of the conductive post.

The at least one center dummy post may be disposed to surround the semiconductor chip.

According to an aspect of the disclosure, a semiconductor package includes: a lower redistribution structure including an insulating layer, a connection pad and an upper pad, wherein the connection pad and the upper pad are disposed on an upper surface of the insulating layer; an external connection terminal disposed below the lower redistribution structure; a semiconductor chip mounted on the lower redistribution structure and connected to the upper pad; a conductive post disposed on the connection pad; at least one dummy post disposed adjacent to the semiconductor chip on the lower redistribution structure; an upper redistribution structure disposed on the semiconductor chip and connected to the conductive post; and an encapsulant disposed between the lower redistribution structure and the upper redistribution structure and configured to cover the semiconductor chip, wherein a height of the at least one dummy post is less than a height of the conductive post, an upper surface of the at least one dummy post is spaced apart from the upper redistribution structure, and a portion of the at least one dummy post is embedded in the insulating layer.

The upper surface of the at least one dummy post may be covered by the encapsulant.

According to example embodiments of the technical concept of the present disclosure, a dummy post may be formed simultaneously with a conductive post, and may adjust a height of the conductive post formed by plating. Therefore, when the conductive post is removed in a subsequent planarization process, occurrence of copper burrs may be reduced, thereby reducing defects in packages.

Various useful advantages and effects of the present disclosure are not limited to the above and may be relatively easily understood in a process of describing exemplary embodiments of the present disclosure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1:
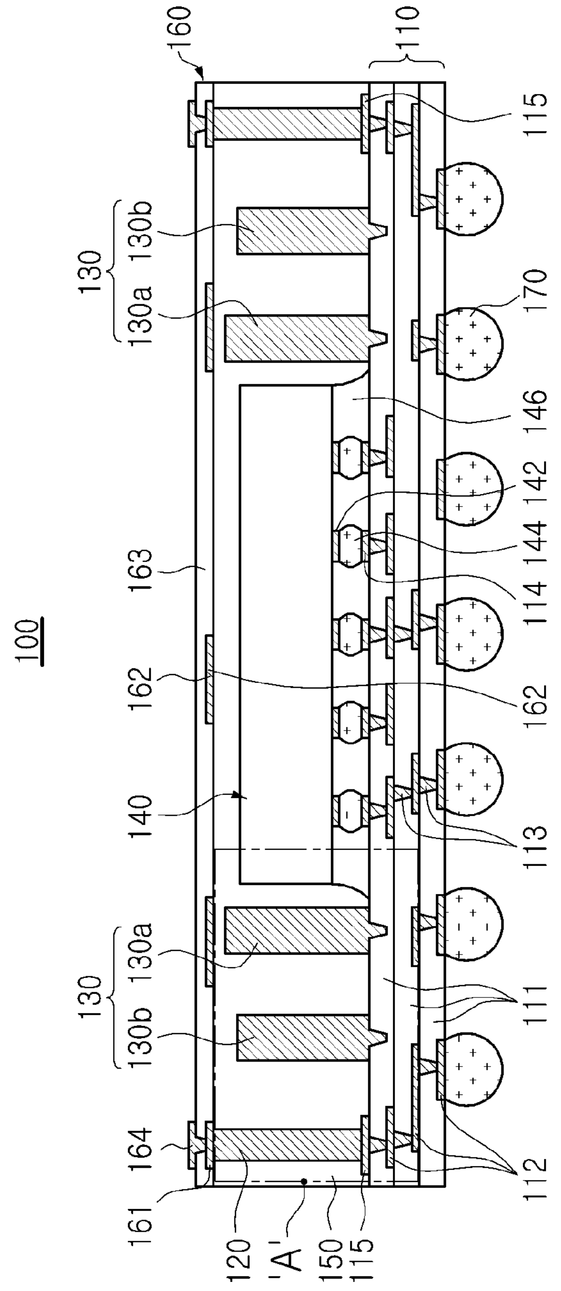
FIG. 1 is a cross-sectional view of a semiconductor package according to embodiments.
Figure 2:
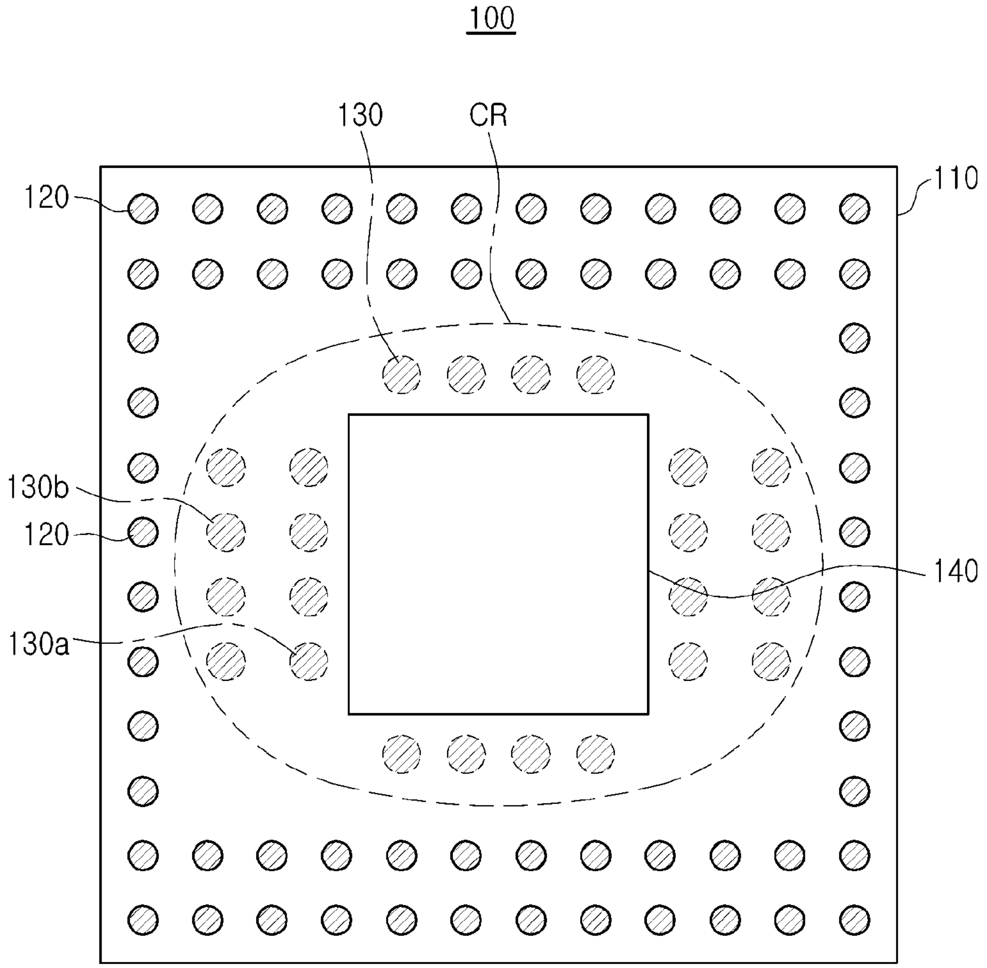
FIG. 2 is a partial plan view of a semiconductor package illustrated in FIG. 1.

FIG. 1 is a cross-sectional view of a semiconductor package according to example embodiments. FIG. 2 is a partial plan view of a semiconductor package illustrated in FIG. 1.

Referring to FIGS. 1 to 2, a semiconductor package 100 according to an example embodiment of the present disclosure may include a lower redistribution structure 110, a conductive post 120, a dummy post 130, a semiconductor chip 140, an encapsulant 150, an upper redistribution structure 160, and an external connection terminal 170.

The lower redistribution structure 110 may include an insulating layer 111, an internal wiring 112, a via 113, an upper pad 114, and a connection pad 115. The insulating layers 111 may form a plurality of layers, and the internal wirings 112 may be formed between the insulating layers 111 and may extend in a horizontal direction. The vias 113 may connect the internal wirings 112 of different layers. The internal wirings 112 and the vias 113 may be embedded in the insulating layers 111. The upper pad 114 and the connection pad 115 may be disposed on the insulating layer 111 in an uppermost portion of the insulating layers 111. The upper pad 114 may be disposed in a center portion of an upper surface of the lower redistribution structure 110, and the connection pad 115 may be disposed at an edge of the upper surface of the lower redistribution structure 110. In some example embodiments, a horizontal width of the connection pad 115 may be greater than a horizontal width of the upper pad 114. The upper pad 114 and the connection pad 115 may be electrically connected to the internal wiring 112 through the via 113. The connection pad 115 may electrically connect the conductive post 120 to the lower redistribution structure 110 and may reinforce the height of the conductive post 120. In an example embodiment, the lower redistribution structure 110 may include a center region CR and an edge region ER. The center region CR may refer to a region in which the semiconductor chip 140 is disposed and a region including a periphery thereof in a plan view, and may correspond to a center portion of the lower redistribution structure 110 in a plan view. The edge region ER may refer to a corner portion of the lower redistribution structure 110, and the lower redistribution structure 110 may include four edge regions ER (see, e.g., FIG. 4).

The conductive post 120 and the dummy post 130 may be disposed on the lower redistribution structure 110. The conductive post 120 may be disposed on the connection pad 115 and may be electrically connected to the internal wiring 112 of a lower structure 110*p* through the connection pad 115. The dummy post 130 is not disposed on the connection pad 115 and may be in direct contact with the insulating layer 111. The dummy post 130 may not be electrically connected to the lower redistribution structure 110. The dummy post 130 may include the same material as the conductive post 120, for example, copper (Cu).

The dummy post 130 may be disposed in a region in which a pattern density of the conductive post 120 is relatively small, during a process of forming the conductive post 120 described below. The dummy post 130 may prevent the conductive post 120 from being unnecessarily formed high during the process of forming the conductive post 120 described. In an example embodiment, the dummy post 130 may be disposed in the center region CR. For example, the dummy post 130 may be disposed adjacent to the semiconductor chip 140, and in a plan view, the dummy post 130 may be disposed to surround the semiconductor chip 140. As illustrated in FIG. 2, cross-sections of the conductive post 120 and the dummy post 130 may be formed to be circular. However, the present disclosure is not limited thereto, and in some example embodiments, the cross sections of the conductive post 120 and the dummy post 130 may have various shapes such as ellipses, rectangles, and squares. Among the dummy posts 130 disposed in the center region CR, a dummy post relatively close to the semiconductor chip 140 may be referred to as a first dummy post 130*a*, and a dummy post relatively far from the semiconductor chip 140 may be referred to as a second dummy post 130*b*.

Figure 3:
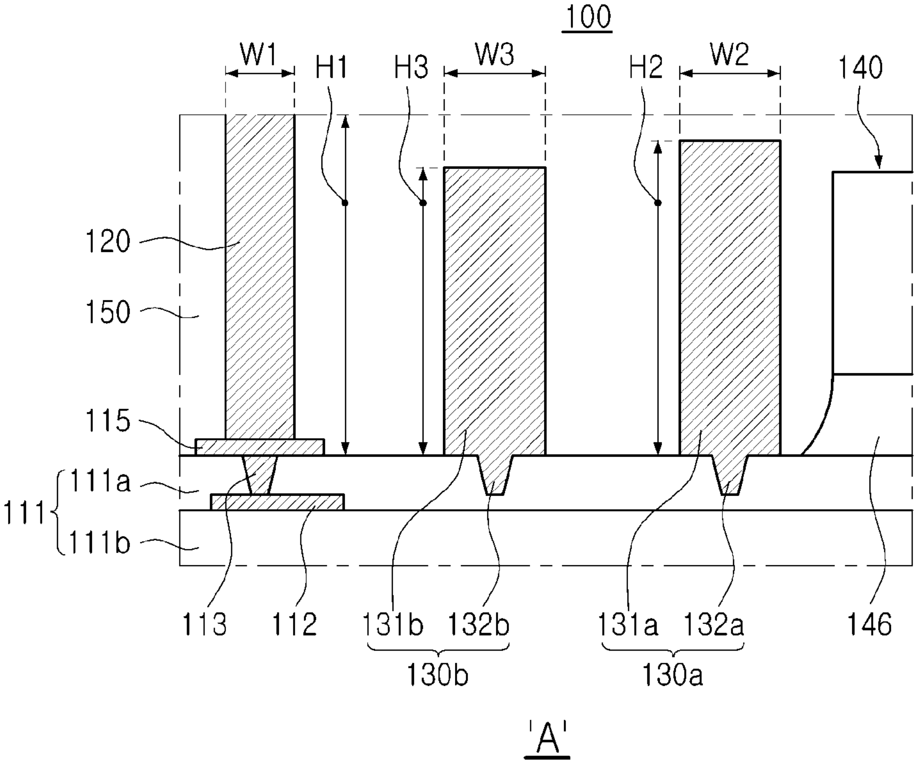
FIG. 3 is a partial enlarged view of a semiconductor package illustrated in FIG. 1.

FIG. 3 is a partial enlarged view of a semiconductor package illustrated in FIG. 1. FIG. 3 may correspond to a region 'A' of FIG. 1.

Referring to FIG. 3, an uppermost insulating layer 111 of the insulating layers 111 may be referred to as a first insulating layer 111*a*, and an insulating layer 111 directly below the first insulating layer 111*a* among the insulating layers 111 may be referred to as a second insulating layer 111*b*. The connection pad 115 may be disposed on the first insulating layer 111*a* and may be connected to the internal wiring 112 through the via 113. The first dummy post 130*a* may include a first body portion 131*a* and a first protrusion 132*a*, and the second dummy post 130*b* may include a second body portion 131*b* and a second protrusion 132*b*. In an example embodiment, the first body portion 131*a* and the second body portion 131*b* may have a cylinder shape and may be disposed on the first insulating layer 111*a*. The first protrusion 132*a* and the second protrusion 132*b* may protrude vertically downward from lower surfaces of the first body portion 131*a* and the second body portion 131*b*, respectively, and may partially penetrate through the first insulating layer 111*a*. For example, the first protrusion 132*a* and the second protrusion 132*b* may be embedded in the first insulating layer 111*a*, but may not be in contact with the second insulating layer 111*b* or may not be embedded in the second insulating layer 111*b*. The first protrusion 132*a* and the second protrusion 132*b* may have a tapered shape in which a horizontal width thereof decreases toward the bottom, but the present disclosure is not limited thereto. The first protrusion 132*a* and the second protrusion 132*b* may be formed integrally with the first body portion 131*a* and the second body portion 131*b*, respectively, and the horizontal width of each of the first protrusion 132*a* and the second protrusion 132*b* may be smaller than a horizontal width W2 of the first body portion 131*a* and a horizontal width W3 of the second body portion 131*b*. For example, a horizontal width of an upper end of the first protrusion 132*a* is smaller than the horizontal width W2 of the first body portion 131*a*, and a lower surface of the first body portion 131*a* may be in contact with an upper surface of the first insulating layer 111*a*. In addition, the horizontal width of the upper end of the second protrusion 132*b* is smaller than the horizontal width W3 of the second body portion 131*b*, and a lower surface of the second body portion 131*b* may be in contact with the upper surface of the first insulating layer 111*a*.

In one example embodiment, the horizontal width W2 of the first dummy post 130*a* and the horizontal width W3 of the second dummy post 130*b* may be greater than the horizontal width W1 of the conductive post 120. Here, the horizontal widths of the dummy posts 130*a* and 130*b* may refer to a maximum horizontal width of the dummy posts 130*a* and 130*b*, and may refer to the horizontal width of the body portions 131*a* and 131*b*. For example, the horizontal width W2 of the first body portion 131*a* of the first dummy post 130*a* and the horizontal width W3 of the second body portion 131*b* of the second dummy post 130*b* may be greater than the horizontal width W1 of the conductive post 120. A difference between the horizontal widths W2 and W3 of the dummy post 130 and the horizontal width W1 of the conductive post 120 may be 20 μm to 50 μm.

In an example embodiment, a height H2 of the first dummy post 130*a* and a height H3 of the second dummy post 130*b* may be smaller than a height H1 of the conductive post 120. Here, the height of the dummy posts 130*a* and 130*b* may refer to a distance from the upper surface of the first insulating layer 111*a* to an upper surface of the body portions 131*a* and 131*b*, and the height of the conductive post 120 may refer to a distance from the upper surface of the first insulating layer 111*a* to an upper surface of the conductive post 120. For example, an upper surface of the first dummy post 130*a* and an upper surface of the second dummy post 130*b* may be disposed at a lower level than the upper surface of the conductive post 120. A difference between the heights H2 and H3 of the dummy post 130 and the height H1 of the conductive post 120 may be 10 μm to 15 μm. In an example embodiment, the height H2 of the first dummy post 130*a* may be greater than the height H3 of the second dummy post 130*b*. For example, the upper surface of the first dummy post 130*a* may be disposed at a higher level than the upper surface of the second dummy post 130*b*.

In an example embodiment, the sizes of the first protrusion 132*a* and the second protrusion 132*b* may be substantially the same. For example, the first protrusion 132*a* and the second protrusion 132*b* may have substantially the same size as the via 113 in contact with the connection pad 115. Lower surfaces of the first protrusion 132*a* and the second protrusion 132*b* may be disposed at the same level as a lower surface of the via 113 in contact with the connection pad 115.

Referring again to FIGS. 1 and 2, the semiconductor chip 140 may be mounted on the lower redistribution structure 110. The semiconductor chip 140 may be a logic chip or a memory chip. The logic chip may include a microprocessor, an analog device, or a digital signal processor. The memory chip may include a volatile memory chip such as a dynamic random access memory (DRAM) or a static random access memory (SRAM), or a nonvolatile memory chip such as a phase-change random access memory (PRAM), a magnetoresistive random access memory (MRAM), a ferroelectric random access memory (FeRAM) or a resistive random access memory (RRAM).

The semiconductor package 100 may further include a bump 144 and an underfill 146 disposed between the lower redistribution structure 110 and the semiconductor chip 140. In an example embodiment, the semiconductor chip 140 may be mounted on the lower redistribution structure 110 in a flip-chip bonding manner. For example, the semiconductor chip 140 may include a chip pad 142 on a lower surface thereof, the chip pad 142 may be in contact with the bump 144, and the bump 144 may be in contact with the upper pad 114. The underfill 146 may cover the bump 144 between the lower redistribution structure 110 and the semiconductor chip 140.

The encapsulant 150 may be disposed on the lower redistribution structure 110, and may cover the lower redistribution structure 110, the conductive post 120, the dummy post 130, and the semiconductor chip 140. An upper surface of the encapsulant 150 may be coplanar with the upper surface of the conductive post 120, but may not be coplanar with an upper surface of the dummy post 130. For example, the upper surface of the dummy post 130 may be completely covered by the encapsulant 150 and may be disposed at a lower level than the upper surface of the encapsulant 150.

The upper redistribution structure 160 may be disposed on the encapsulant 150. The upper redistribution structure 160 may include a lower connection pad 161, an internal wiring 162, an insulating layer 163, and an upper connection pad 164. The lower connection pad 161 and the internal wiring 162 may be disposed on the upper surface of the encapsulant 150, and the lower connection pad 161 may be in contact with the upper surface of the conductive post 120. The insulating layer 163 may cover the lower connection pad 161 and the internal wiring 162. The upper connection pad 164 may be disposed on the insulating layer 163 and may be electrically connected to the lower connection pad 161. The upper redistribution structure 160 may be electrically connected to the lower redistribution structure 110 through the conductive post 120. However, the upper redistribution structure 160 may not be in contact with the upper surface of the dummy post 130 and may not be electrically connected to the dummy post 130.

The external connection terminal 170 is disposed below the lower redistribution structure 110 and may be electrically connected to at least one of the internal wirings 112. A passivation layer may be further disposed on a lower surface of the lower redistribution structure 110, and an under-bump metal may be further disposed between the external connection terminal 170 and on the lower redistribution structure 110.

Figure 4:
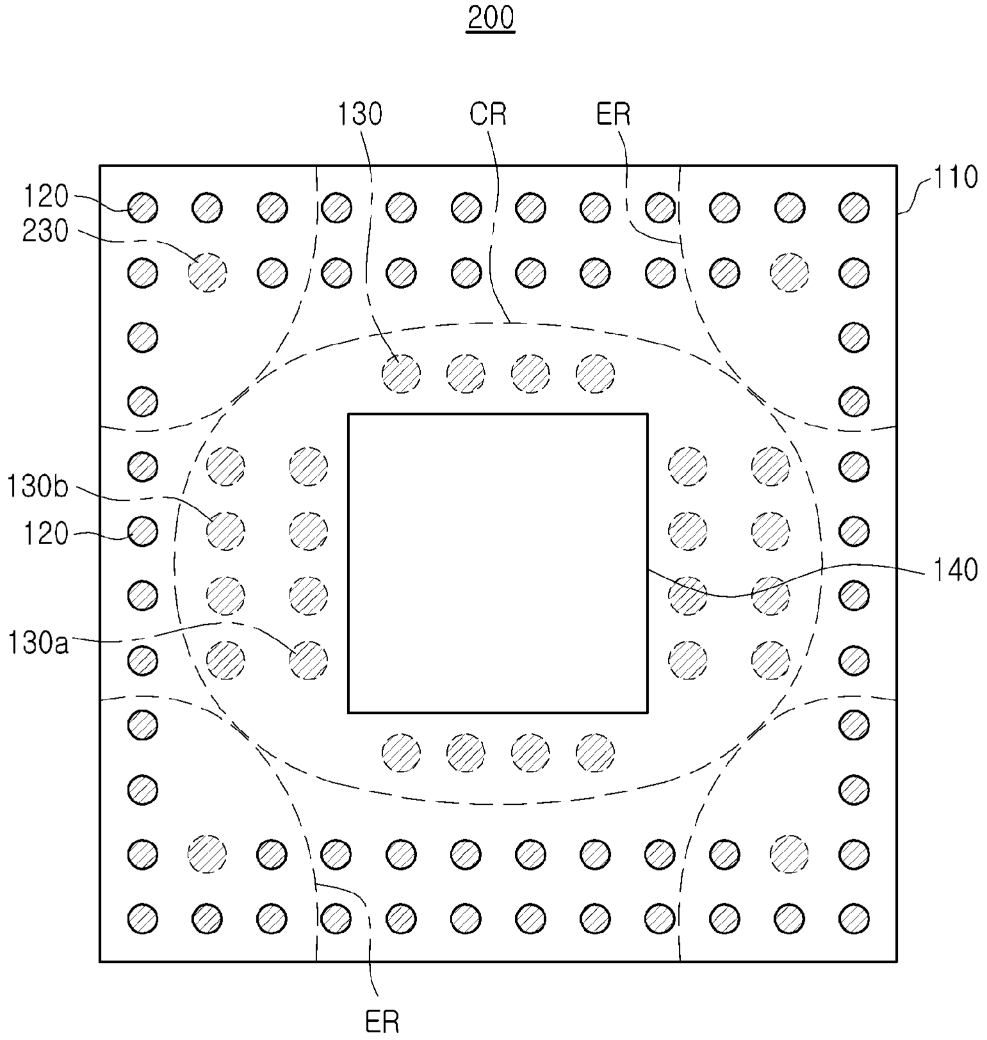
FIG. 4 is a plan view of a semiconductor package according to an example embodiment.

FIG. 4 is a plan view of a semiconductor package according to an example embodiment.

Referring to FIG. 4, a semiconductor package 200 may further include a dummy post 230 disposed in the edge region ER. For example, the dummy post 230 may be disposed in each of the four edge regions ER. The dummy post 230 disposed in the edge region ER may have the same structure as the dummy post 130 described with reference to FIGS. 1 to 3, and a detailed description thereof may be omitted. The dummy post 230 may prevent the conductive post 120 from being unnecessarily formed high during the process of forming the conductive post 120 described below. The dummy post 130 disposed in the center region CR may be disposed adjacent to the semiconductor chip 140, but the dummy post 230 disposed in the edge region ER may be disposed far from the semiconductor chip 140. For example, the dummy post 230 disposed in the edge region ER may be disposed adjacent to a corner of the semiconductor package 200. In the present specification, the dummy post 130 disposed in the center region CR may be referred to as a 'center dummy post,' and the dummy post 230 disposed in the edge region ER may be referred to as an 'edge dummy post.'

FIGS. 5 to 8 are cross-sectional views of semiconductor packages according to embodiments.

Figure 5:
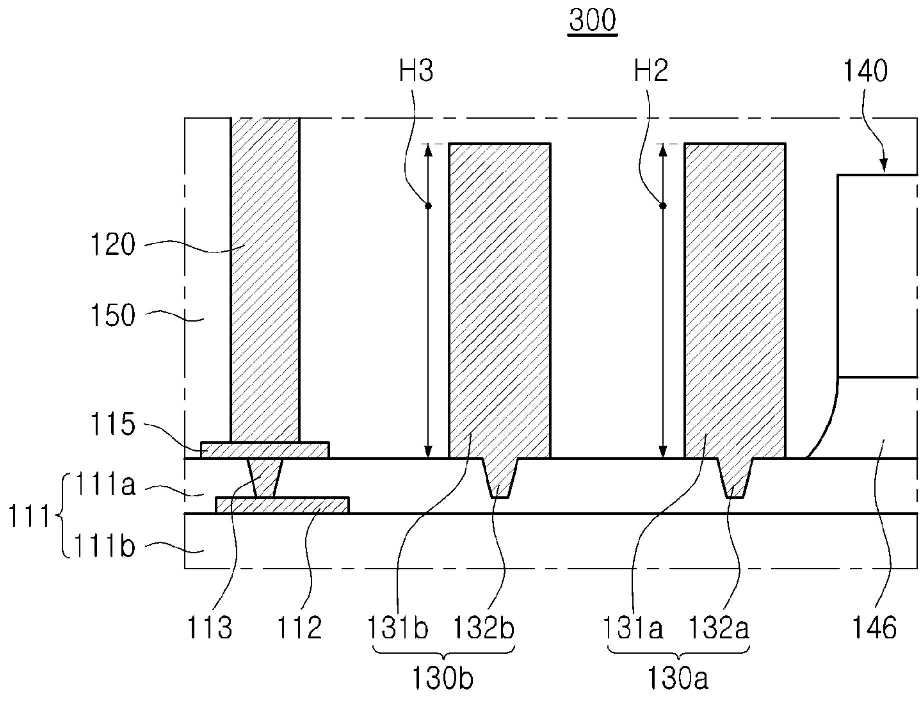
FIGS. 5 to 8 are cross-sectional views of semiconductor packages according to example embodiments.

Referring to FIG. 5, a semiconductor package 300 may include a first dummy post **130*a* and a second dummy post 130*b* on the insulating layer 111. In an example embodiment, the height H2 of the first dummy post 130*a* may be the same as the height H3 of the second dummy post 130*b*. For example, the upper surface of the first dummy post 130*a* may be disposed at the same level as the upper surface of the second dummy post 130*b***.

Figure 6:
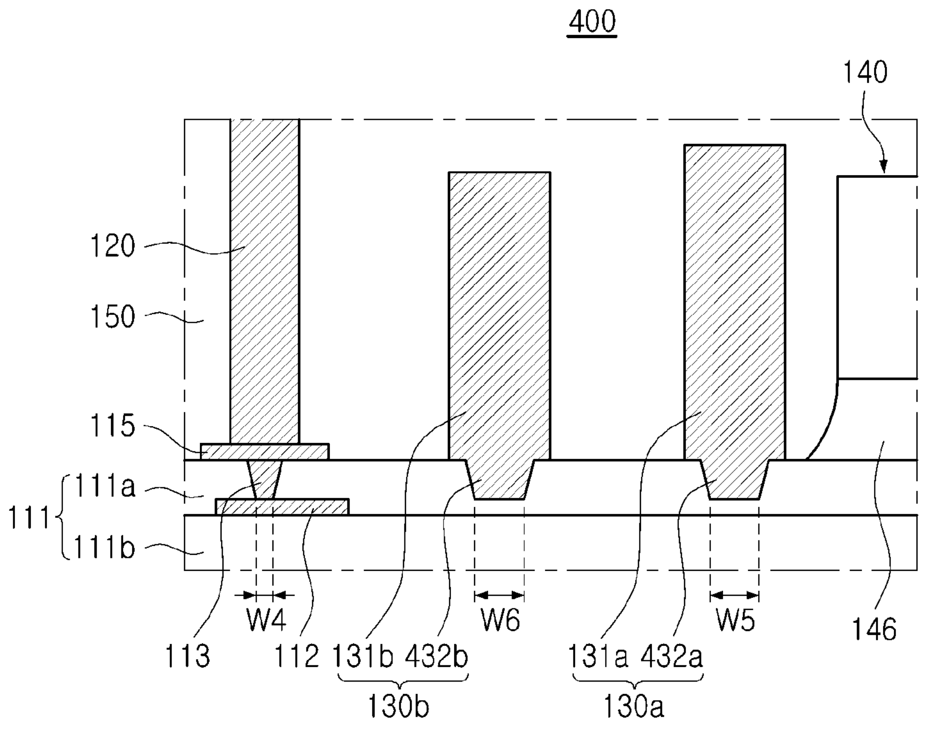

Referring to FIG. 6, a semiconductor package 400 may include a first dummy post **130*a* and a second dummy post 130*b* on the insulating layer 111. In an example embodiment, a first protrusion 432*a* of the first dummy post 130*a* and a second protrusion 432*b* of the second dummy post 130*b* may be larger than the via 113 in contact with the connection pad 115. For example, a horizontal width W5 of a lower surface of the first protrusion 432*a* and a horizontal width W6 of a lower surface of the second protrusion 432*b* may be greater than a horizontal width W4 of the via 113. During the process of forming the conductive post 120 described below, since the first protrusion 432*a* and the second protrusion 432*b* are largely formed, the conductive post 120** may be formed to be lower.

Figure 7:
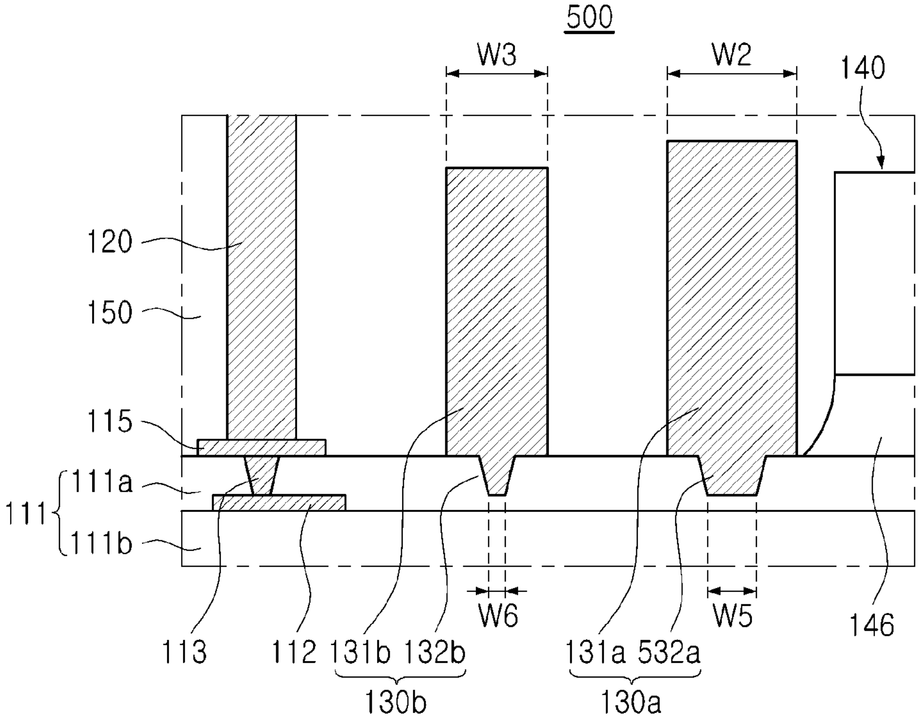

Referring to FIG. 7, a semiconductor package 500 may include a first dummy post **130*a* and a second dummy post 130*b* on the insulating layer 111. In an example embodiment, the first dummy post 130*a* may be larger than the second dummy post 130*b*. For example, a horizontal width W2 of a first body portion 531*a* of the first dummy post 130*a* may be greater than the horizontal width W3 of the second body portion 131*b* of the second dummy post 130*b*. A horizontal width W5 of a lower surface of a first protrusion 532*a* of the first dummy post 130*a* may be greater than a horizontal width W6 of a lower surface of the second protrusion 132*b* of the second dummy post 130*b***.

Figure 8:
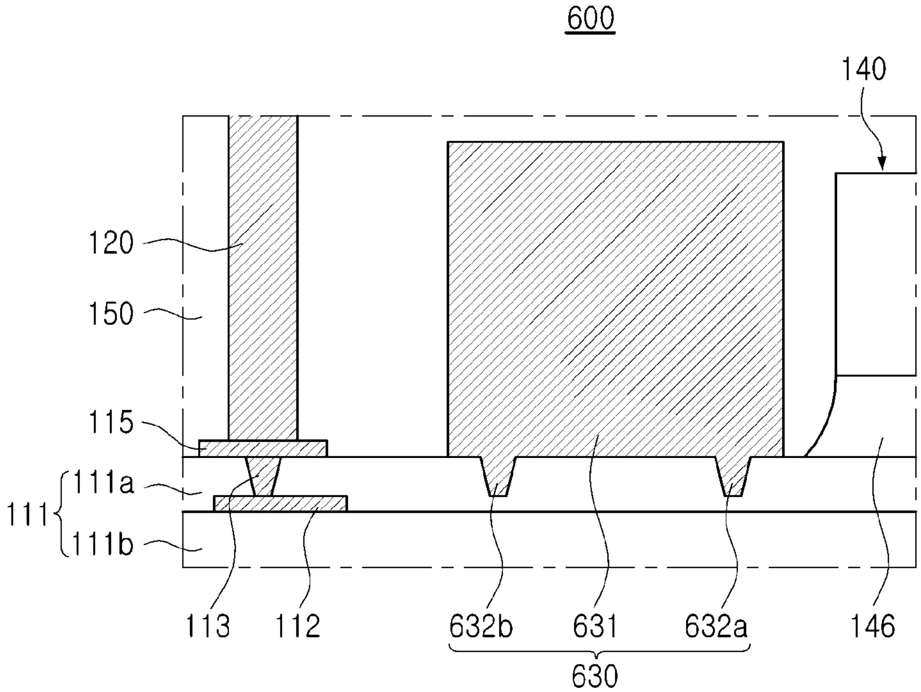

Referring to FIG. 8, a semiconductor package 600 may include a dummy post 630 on the insulating layer 111. In an example embodiment, the dummy post 630 may include a body portion 631 and a first protrusion **632*a* and a second protrusion 632*b* connected to the body portion 631. A horizontal width of the body portion 631 may be greater than a distance between the first protrusion part 632*a* and the second protrusion part 632*b*. Although FIG. 8 illustrates that two protrusions are connected to the body portion, the present disclosure is not limited thereto. In some example embodiments, the dummy post 630 may include three or more protrusions connected to the body portion 631**.

Figure 9:
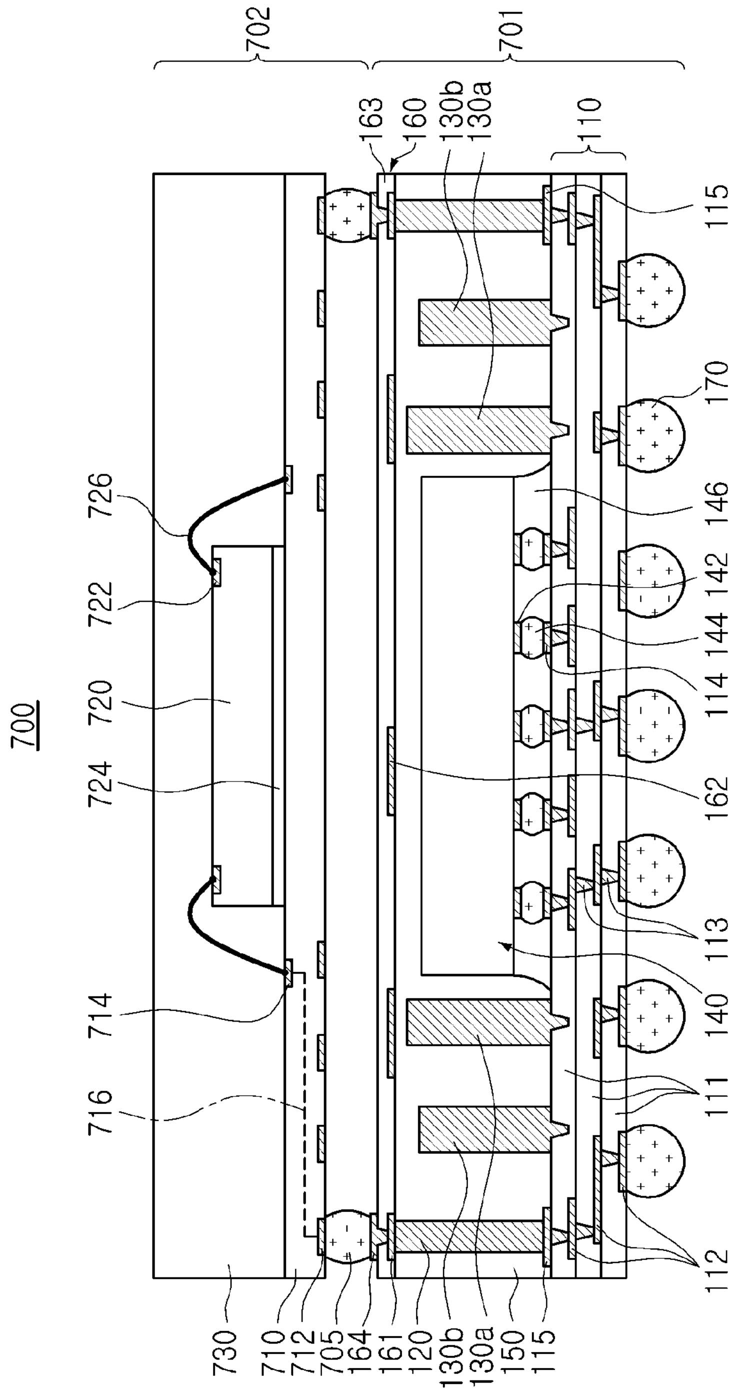
FIG. 9 is a cross-sectional view of a semiconductor package according to an example embodiment.

FIG. 9 is a cross-sectional view of a semiconductor package according to an example embodiment.

Referring to FIG. 9, a semiconductor package 700 may have a package-on-package structure. For example, the semiconductor package 700 may include a lower package 701 and an upper package 702. Since the lower package 701 may have the same or similar structure as the semiconductor packages 100, 200, 300, 400, 500 and 600 described with reference to FIGS. 1 to 8, a detailed description of the lower package 701 may be omitted.

The upper package 702 may be connected to the lower package 701 by a package connection terminal 705. The upper package 702 may include a package substrate 710, a semiconductor chip 720, and an encapsulant 730. The package substrate 710 may include a lower pad 712, an upper pad 714, and a wiring 716 electrically connecting the lower pad 712 to the upper pad 714. The lower pad 712 may be in contact with the package connection terminal 705.

The semiconductor chip 720 may include a chip pad 722 on an upper surface thereof, and may be attached to the package substrate 710 by an adhesive layer 724. In an example embodiment, the semiconductor chip 720 may be mounted on the package substrate 710 by wire bonding. For example, the chip pad 722 of the semiconductor chip 720 may be connected to the upper pad 714 by a wire 726. In an example embodiment, a semiconductor chip 140 of the lower package 701 and the semiconductor chip 720 of the upper package 702 may be different types of chips. For example, the semiconductor chip 140 of the lower package 701 may be a logic chip, and the semiconductor chip 720 of the upper package 702 may be a memory chip. The encapsulant 730 may cover the package substrate 710 and the semiconductor chip 720.

Figure 10:
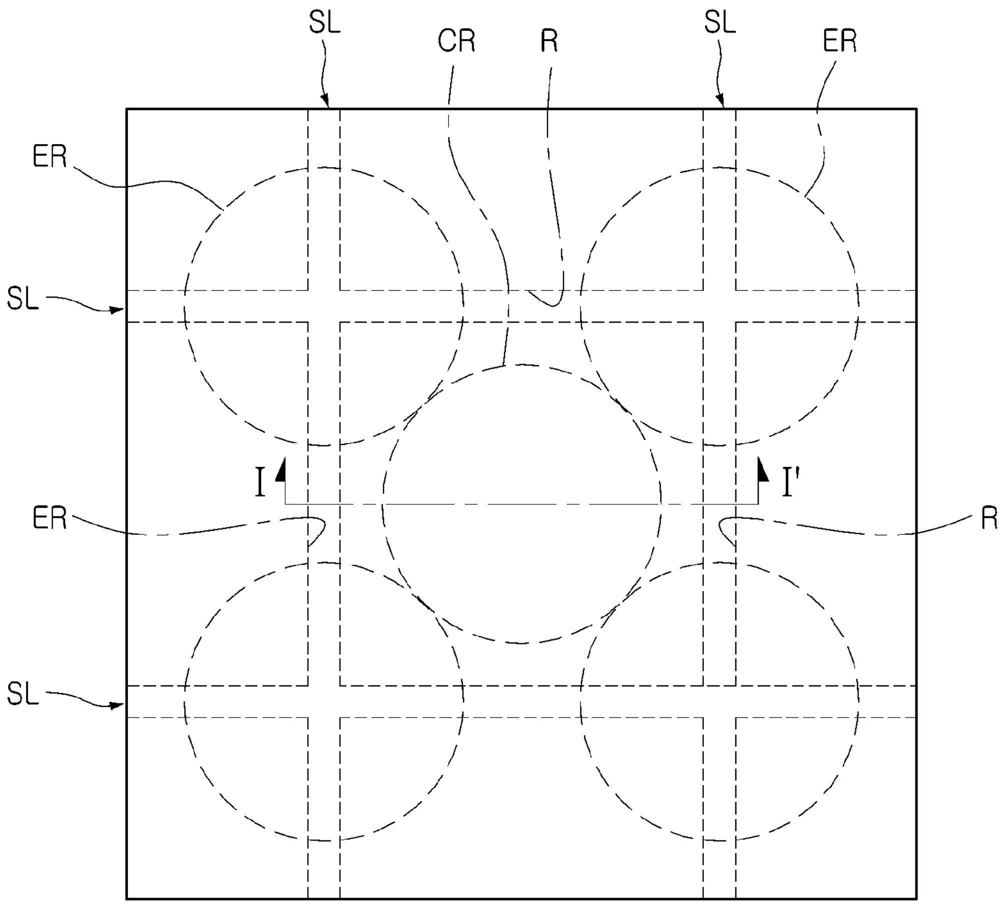
FIGS. 10 to 20 are plan views and cross-sectional views illustrating a method of manufacturing semiconductor packages according to exemplary embodiments according to a process sequence.
Figure 11:
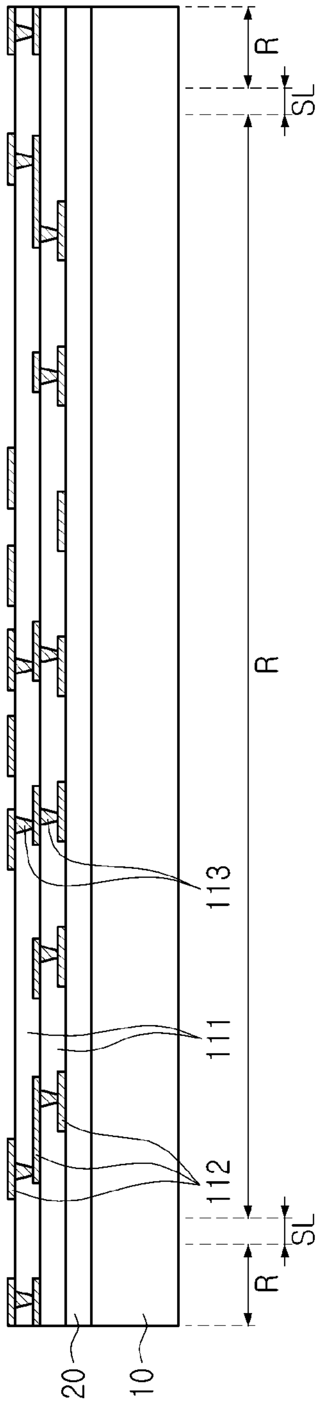

FIGS. 10 to 20 are plan views and cross-sectional views illustrating a method of manufacturing semiconductor packages according to exemplary embodiments according to a process sequence. FIG. 11 may be a cross-sectional view taken along line I-I' of the structure illustrated in FIG. 10.

The structure illustrated in FIGS. 10 and 11 may include a package region R, a center region CR, an edge region ER, and a scribe line SL. The scribe line SL may refer to a portion removed during a sawing process described below with reference to FIG. 20, and the package region R may refer to a portion forming one semiconductor package 100. The center region CR may refer to a region in which the semiconductor chip 140 is disposed and a peripheral region thereof, and the package region R may correspond to a center portion. The edge region ER may refer to a region including a portion of the scribe line SL between corners of adjacent package regions R.

Referring to FIGS. 10 and 11, an insulating layer 111, an internal wiring 112, and a via 113 may be formed on a carrier substrate 10 and the adhesive layer 20. The carrier substrate 10 may be a conductive substrate including a glass carrier, a ceramic carrier, a silicon wafer, or a metal. The adhesive layer 20 may be disposed on the carrier substrate 10 and may attach the lower redistribution structure 110 to the carrier substrate 10. The adhesive layer 20 may include a polymer-based material. For example, the adhesive layer 20 may include a light-to-heat-conversion (LTHC) release coating material and may be thermal-released by heating. Alternatively, the adhesive layer 20 may include a UV adhesive that is peeled off by ultra-violet (UV) light.

The insulating layers 111 may form a plurality of layers, the internal wirings 112 may be formed between the insulating layers 111, and the vias 113 may connect the internal wirings 112 of different layers. The internal wiring 112 and the via 113 may be integrally formed and may be embedded in the insulating layers 111. The internal wiring 112 and the via 113 may be formed by repeating processes of forming an insulating material on the adhesive layer 20, etching the insulating material to form an opening, and forming a conductive material in the opening. In an example embodiment, the internal wiring 112 and the via 113 may be formed using a damascene process, and the conductive material may be formed using an electroplating method.

The insulating layer 111 may include a photosensitive dielectric (PID). The internal wiring 112 and the via 113 may include a conductive material, for example, copper (Cu), aluminum (Al), silver (Ag), tin (Sn), gold (Au), nickel (Ni), lead (Pb), titanium (Ti), chromium (Cr), tungsten (W), or alloys thereof. In an example embodiment, the conductive material may be formed by using the electroplating method and may include a seed layer and a metal layer on the seed layer. For example, the seed layer may include at least one of copper (Cu), titanium (Ti), nickel (Ni), chromium (Cr) and tungsten (W), and the metal layer may include copper (Cu).

Figure 12:
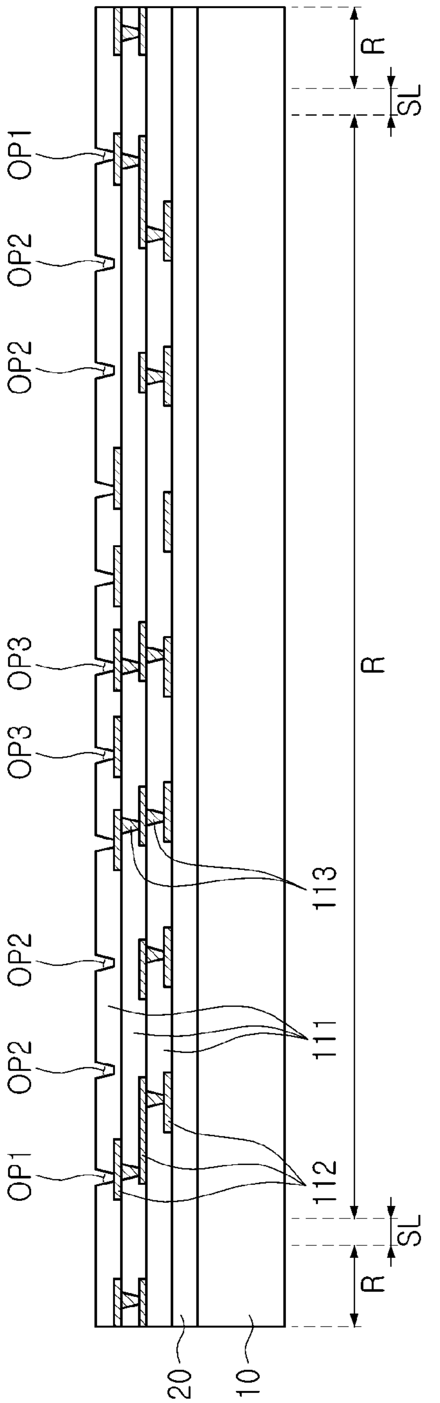

Referring to FIG. 12, the insulating layer 111 may be further formed on the structure illustrated in FIG. 11. A first opening OP1, a second opening OP2, and a third opening OP3 may be formed in the insulating layer 111 in an uppermost portion among the insulating layers 111. The first opening OP1 may be formed in a portion of the insulating layer 111 on which the conductive post 120 will be formed, and may expose an upper surface of at least one of the internal wirings 112. The second opening OP2 may be formed in a portion of the insulating layer 111 on which the dummy post 130 will be formed, and may not expose the internal wiring 112. The third opening OP3 may be formed in a portion of the insulating layer 111 on which the upper pad 114 will be formed, and may expose an upper surface of at least one of the internal wirings 112. The second opening OP2 and the third opening OP3 may be formed in the center region CR illustrated in FIG. 10, and in some example embodiments, at least one first opening OP1 may be formed in the center region CR. The first opening OP1 may be formed in the edge region ER, and in some example embodiments, at least one second opening OP2 may be formed in the edge region ER. An opening may not be formed in the scribe line SL. Horizontal widths and depths of the first opening OP1, the second opening OP2 and the third opening OP3 may be the same, but the present disclosure not limited thereto.

Figure 13:
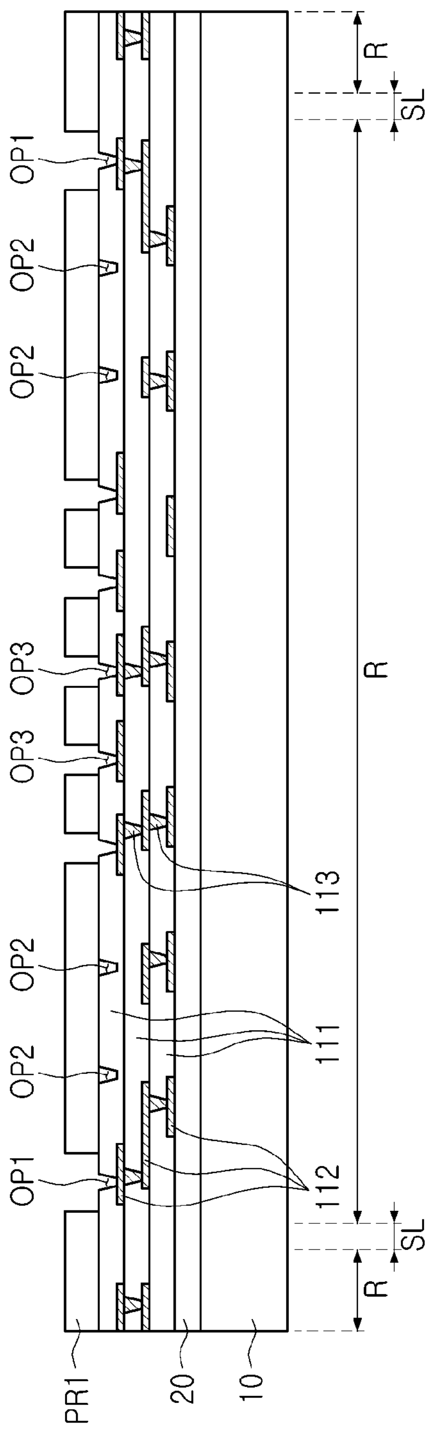

Referring to FIG. 13, a first photoresist PR1 may be formed on the insulating layer 111 at the uppermost portion. The first photoresist PR1 may be patterned to expose the first opening OP1 and the third opening OP3. For example, after forming a photosensitive material on the insulating layer 111 at the uppermost portion, the first opening OP1 and the third opening OP3 may be exposed by performing an exposure process and a development process on the photosensitive material. Then, the first photoresist PR1 may be cured by a baking process. The first photoresist PR1 may not expose the second opening OP2 and may cover a portion of the insulating layer 111 at the uppermost portion corresponding to the second opening OP2.

In an example embodiment, before forming the first photoresist PR1, a seed layer may be conformally formed along surfaces of the insulating layer 111 at the uppermost portion, the first opening OP1, the second opening OP2, and the third opening OP3. The seed layer may be formed by a chemical vaporization deposition (CVD) process or an atomic layer deposition (ALD) process. The seed layer may also cover a portion of the internal wiring 112 exposed by the first opening OP1 and the third opening OP3.

Figure 14:
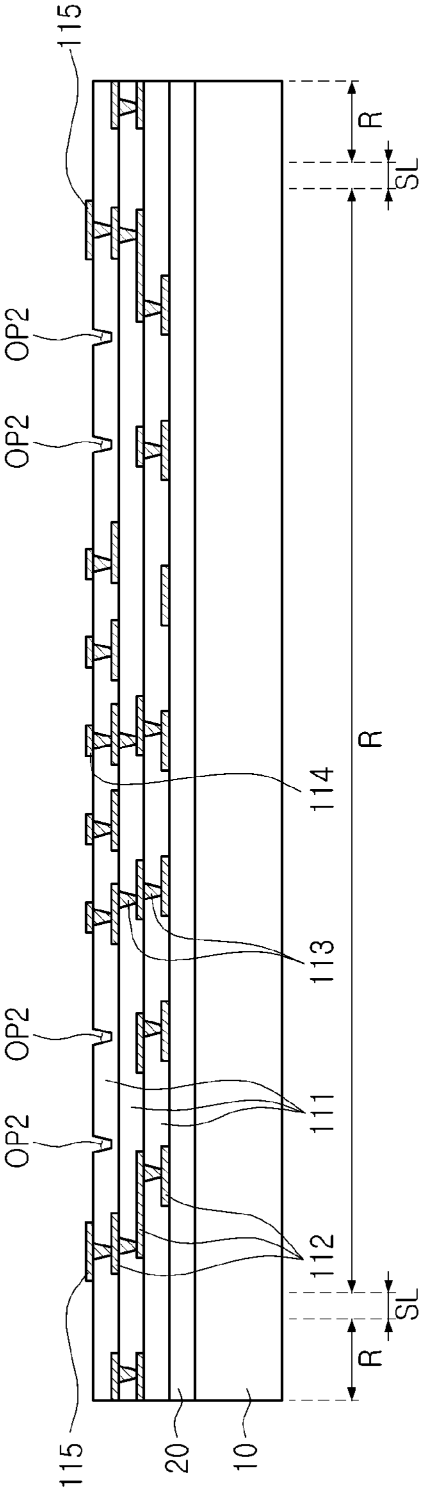

Referring to FIG. 14, an upper pad 114 and a connection pad 115 may be formed on the first opening OP1 and the third opening OP3 to manufacture the lower structure 110*p*. In an example embodiment, the upper pad 114 and the connection pad 115 may be formed on a portion exposed by the first photoresist PR1 by a plating process using the seed layer as a seed. The upper pad 114 may be formed simultaneously with or separately from the connection pad 115. A via 113 connected to at least one of the internal wirings 112 may be further formed below the upper pad 114 and the connection pad 115. The upper pad 114 and the connection pad 115 may be formed integrally with the via 113 disposed below each of the upper pad 114 and the connection pad 115. In addition, the via 113, the upper pad 114, the connection pad 115, and the via 113 may be physically continuous, and boundaries between them may not be distinguished. After forming the upper pad 114 and the connection pad 115, the first photoresist PR1 may be removed, but the seed layer may not be removed. The upper pad 114 and the connection pad 115 may include a conductive material such as copper (Cu), aluminum (Al), silver (Ag), tin (Sn), gold (Au), nickel (Ni), lead (Pb), titanium (Ti), chromium (Cr), tungsten (W), or alloys thereof, for example, copper (Cu).

Figure 15:
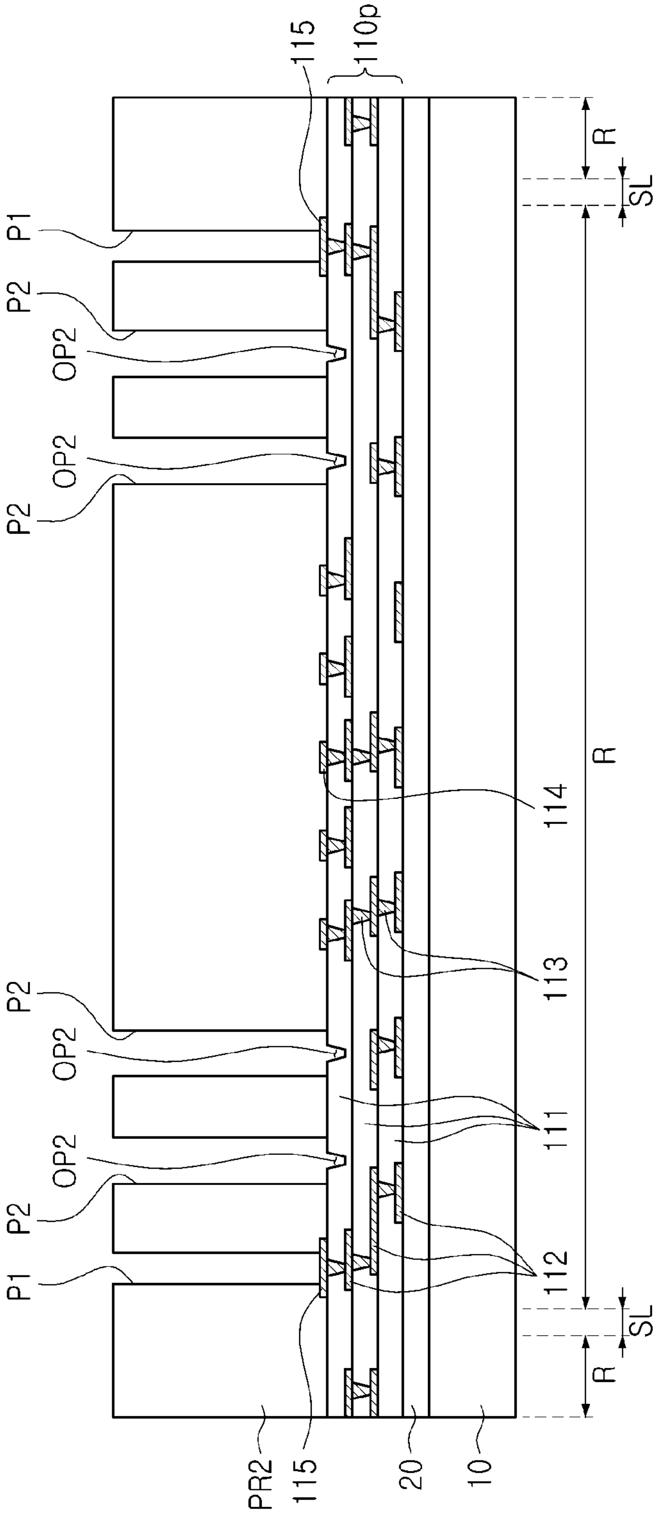

Referring to FIG. 15, a second photoresist PR2 may be formed on the lower structure 110*p*. The second photoresist PR2 may be patterned to expose the connection pad 115 and the second opening OP2. For example, the second photoresist PR2 may include a first opening pattern P1 configured to expose the connection pad 115 and a second opening pattern P2 configured to expose the second opening OP2. A horizontal width of the second opening pattern P2 may be greater than a horizontal width of the first opening pattern P1. The second photoresist PR2 may not expose the upper pad 114 and may cover the upper pad 114.

Figure 16:
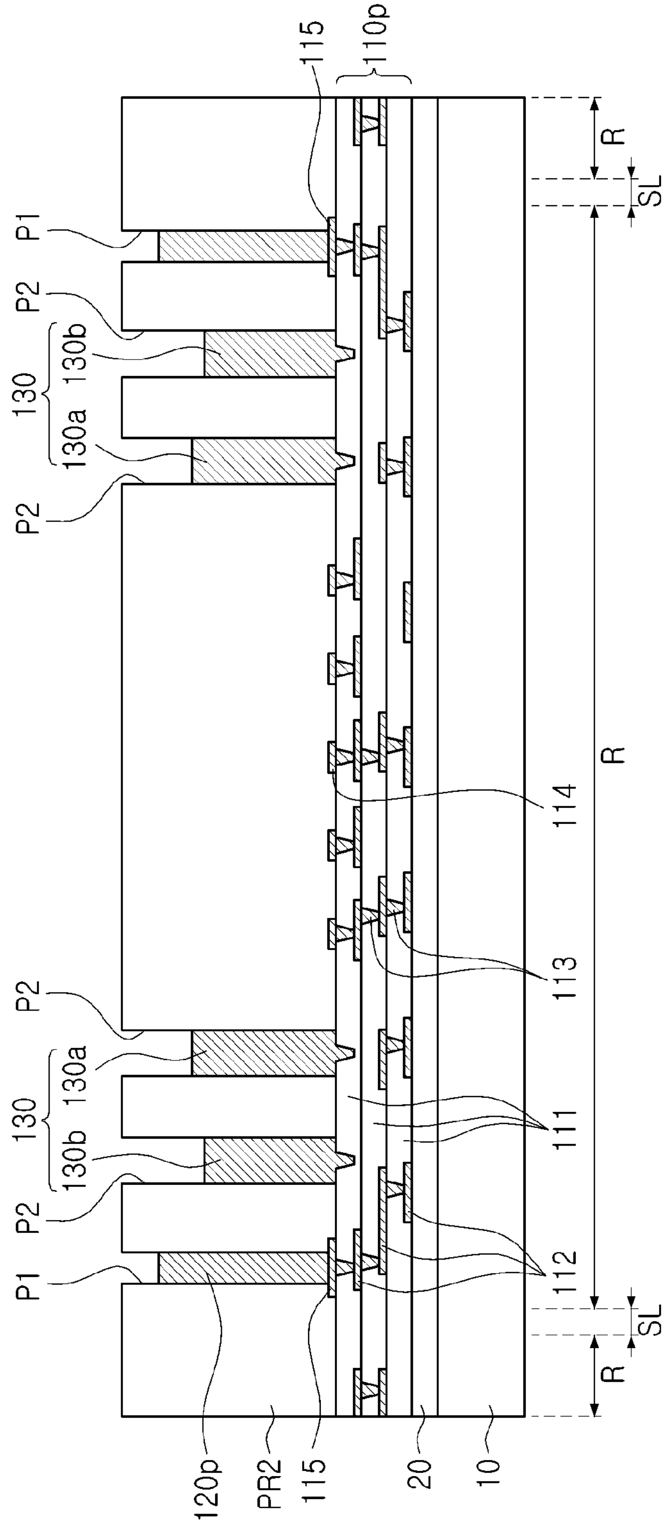

Referring to FIG. 16, a preliminary conductive layer 120*p* and the dummy post 130 may be formed in the first opening pattern P1 and the second opening pattern P2, respectively. In an example embodiment, the preliminary conductive layer 120*p* may be formed by plating a conductive material using the connection pad 115 as a seed, and the dummy post 130 may be formed by plating the conductive material using the seed layer as a seed. The preliminary conductive layer 120*p* may be formed simultaneously with the dummy post 130. The dummy post 130 may be used to adjust the height of the preliminary conductive layer 120*p* during the plating process. The dummy post 130 may be disposed at a region with relatively low pattern density among the preliminary conductive layers 120*p*. For example, when patterning the second photoresist PR2 described with reference to FIG. 15, the second opening pattern P2 may be formed at a region in which the first opening pattern P1 is relatively small. Here, the pattern density may refer to an area density (i.e., an area viewed from a plan view) of a pattern of the conductive material formed by the plating process. That is, the dummy post 130 formed in the second opening pattern P2 may be disposed at the region with relatively low pattern density to locally increase the pattern density. Since the semiconductor chip 140 has to be mounted in the center region CR, and the conductive post 120 is not disposed in the scribe line SL, the center region CR and the edge region ER may have low pattern density. When the pattern density is not uniform, a conductive material that is plated at the region with relatively low pattern density may be formed to be higher. However, in example embodiments of the present disclosure, the dummy post 130 may be formed at the region with relatively low pattern density (e.g., the center region CR or the edge region ER), thereby preventing the preliminary conductive layer 120*p* from being unnecessarily formed high. The preliminary conductive layer 120*p* may be electrically connected to at least one of the internal wirings 112 through the connection pad 115. The dummy post 130 may not be electrically connected to the preliminary conductive layer 120*p* and the internal wirings 112.

Since the horizontal width of the second opening pattern P2 is greater than the horizontal width of the first opening pattern P1, the dummy post 130 formed in the second opening pattern P2 may be lower than the preliminary conductive layer 120*p* formed in the first opening pattern P1. For example, the upper surface of the dummy post 130 may be disposed at a lower level than an upper surface of the preliminary conductive layer 120*p*. In an example embodiment, the dummy posts 130 may include a first dummy post 130*a* to be relatively close to the semiconductor chip 140 and a second dummy post 130*b* to be relatively far from the semiconductor chip 140. Since the pattern density may be low in a position relatively close to the semiconductor chip 140, the first dummy post 130*a* may be formed higher than the second dummy post 130*b* in an example embodiment.

The preliminary conductive layer 120*p* and the dummy post 130 may include a conductive material such as copper (Cu), aluminum (Al), silver (Ag), tin (Sn), gold (Au), nickel (Ni), lead (Pb), titanium (Ti), chromium (Cr), tungsten (W), or alloys thereof, for example, copper (Cu).

Figure 17:
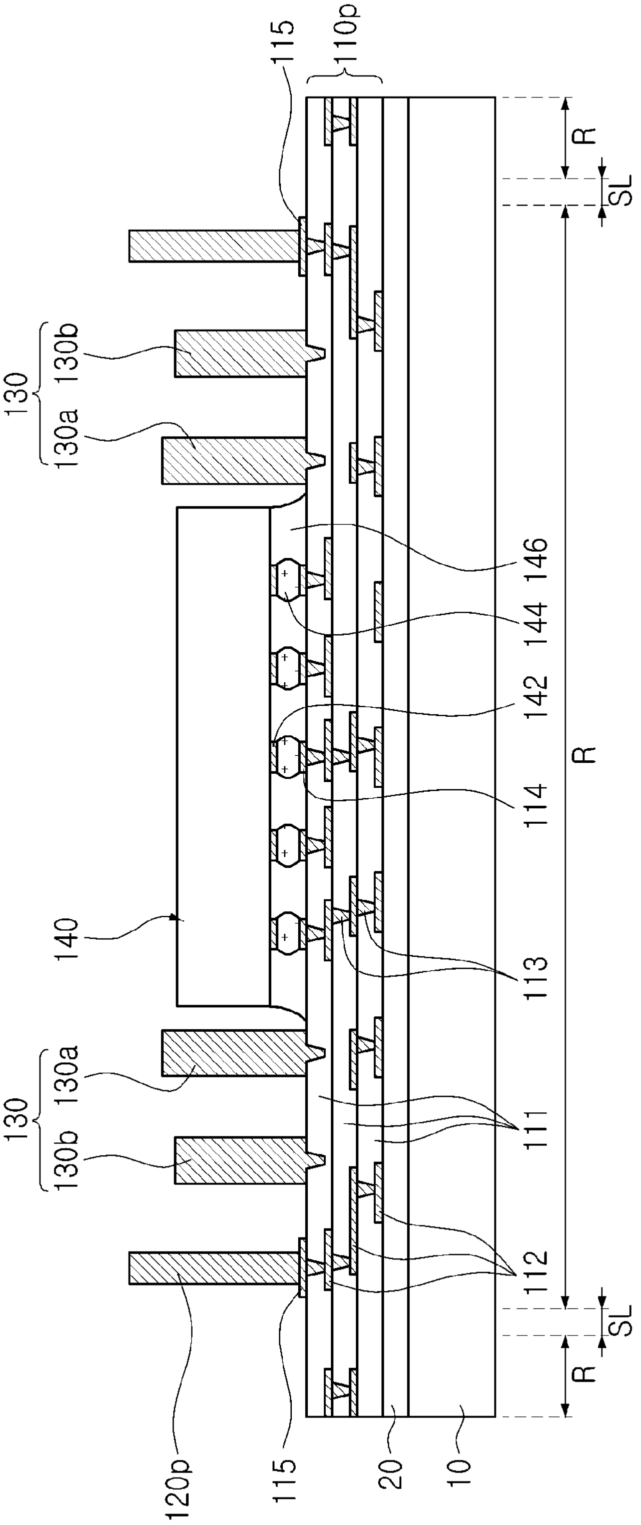

Referring to FIG. 17, the semiconductor chip 140 may be mounted on the lower structure 110*p*. The semiconductor chip 140 may include a chip pad 142 on a lower surface thereof, and may be electrically connected to the upper pad 114 by a bump 144. In addition, an underfill 146 covering the bumps 144 may be formed between the semiconductor chip 140 and the lower structure 110*p*. An upper surface of the semiconductor chip 140 may be disposed at a lower level than the upper surface of the preliminary conductive layer 120*p*.

Figure 18:
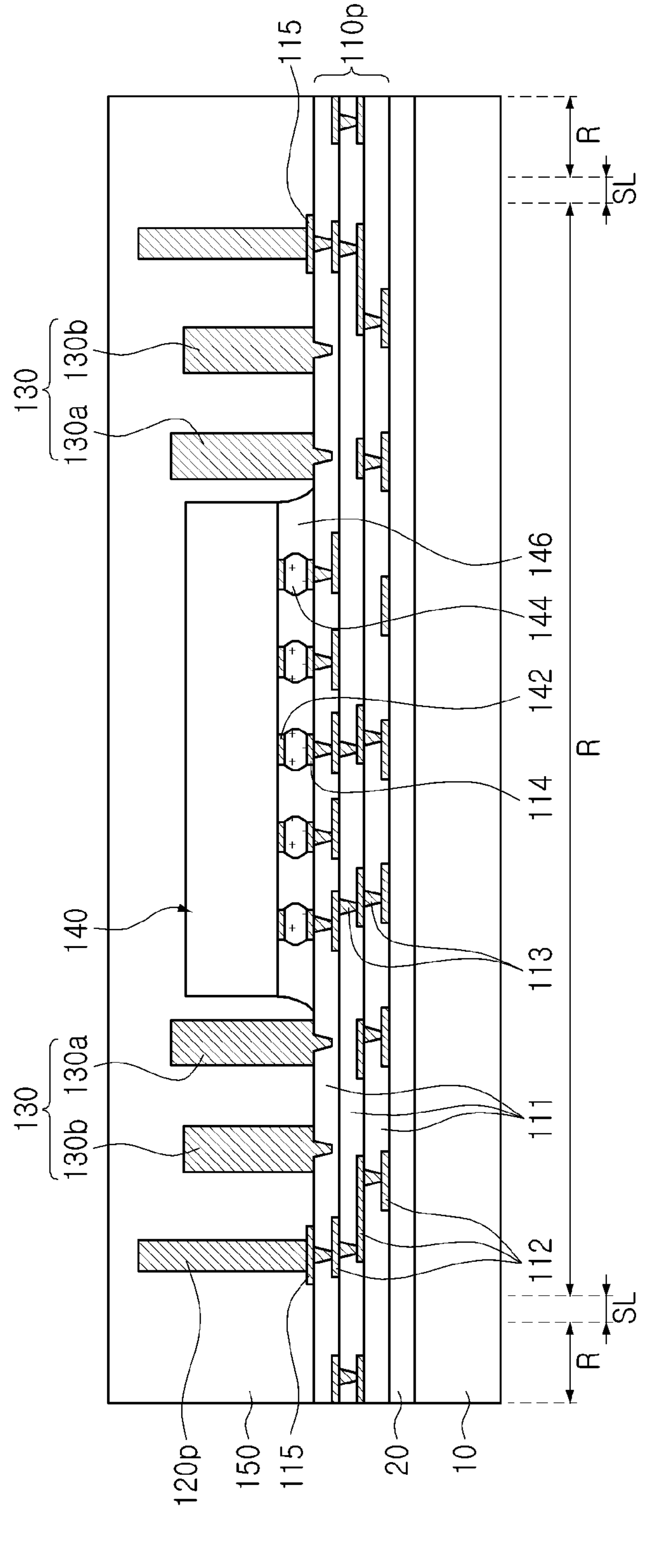

Referring to FIG. 18, an encapsulant 150 covering the lower structure 110*p*, the preliminary conductive layer 120*p*, the dummy post 130 and the semiconductor chip 140 may be formed. The encapsulant 150 may completely cover the upper surface of the preliminary conductive layer 120*p*. The encapsulant 150 may be a resin including epoxy or polyimide. For example, the resin may include a bisphenol-group epoxy resin, a polycyclic aromatic epoxy resin, an o-cresol novolac epoxy resin, a biphenyl-group epoxy resin, or a naphthalene-group epoxy resin.

Figure 19:
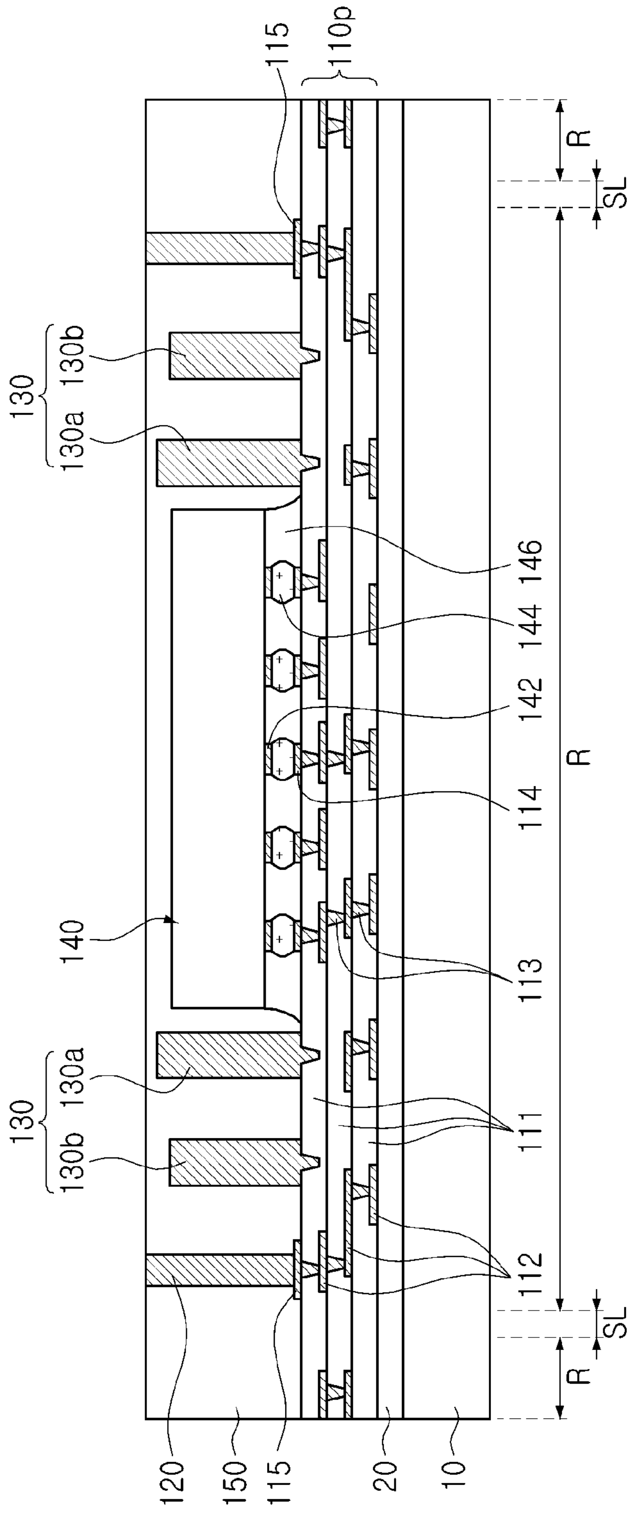

Referring to FIG. 19, a planarization process may be performed so that the encapsulant 150 has a predetermined height. An upper portion of the preliminary conductive layer 120*p* may be partially removed by the planarization process to form the conductive post 120. As described above, since the dummy post 130 for adjusting the height of the conductive post 120 is disposed in the semiconductor package 100 according to example embodiments of the present disclosure, the height of the dummy post 130 may be prevented from being unnecessarily formed high. This may make it possible to reduce a thickness of the preliminary conductive layer 120*p* etched during the planarization process, and to prevent or reduce occurrence of copper (Cu) burrs or a copper (Cu) residue during the planarization process. Accordingly, when forming the upper redistribution structure 160 described below, it is possible to prevent short circuits of wirings, and to reduce defects in the semiconductor package 100.

In order to reduce the occurrence of copper (Cu) residues by the planarization process, the dummy post 130 may be completely covered by the encapsulant 150 and may not be exposed. Furthermore, the semiconductor chip 140 may not be removed by the planarization process, and the upper surface of the semiconductor chip 140 may be covered by the encapsulant 150.

Figure 20:
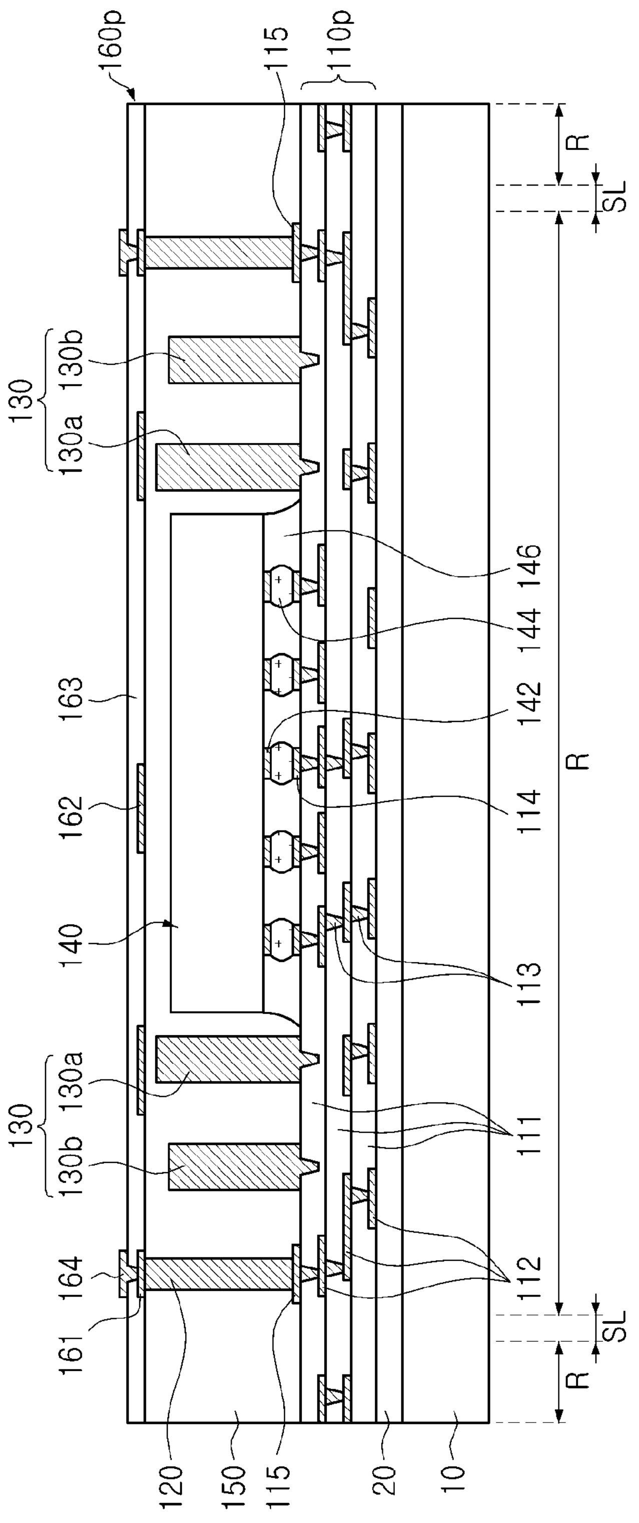

Referring to FIG. 20, an upper structure 160*p* may be formed on the encapsulant 150. The upper structure 160*p* may be formed by repeating processes of forming a conductive material on the encapsulant 150, patterning the conductive material, and forming an insulating material covering the conductive material. The upper structure 160*p* may include a lower connection pad 161, an internal wiring 162, an insulating layer 163, and an upper connection pad 164. The lower connection pad 161 and the internal wiring 162 may be formed on an upper surface of the encapsulant 150 and may be disposed at the same level. The lower connection pad 161 may be in contact with the conductive post 120. The insulating layer 163 may cover the encapsulant 150, the lower connection pad 161, and the internal wiring 162. The upper connection pad 164 may be formed on the insulating layer 163 and may be in contact with the lower connection pad 161. The upper connection pad 164 may be electrically connected to the lower structure 110*p* and the conductive post 120 through the lower connection pad 161. The lower connection pad 161, the internal wiring 162, and the upper connection pad 164 may include the same material as the internal wiring 112 of the lower structure 110*p*. The insulating layer 163 may include the same material as the insulating layer 111 of the lower structure 110*p*.

Referring back to FIG. 1, the carrier substrate 10 and the adhesive layer 20 may be removed, and the external connection terminal 170 electrically connected to the internal wiring 112 may be formed on a lower surface of the lower structure 110*p*. The external connection terminal 170 may include at least one of copper (Cu), nickel (Ni), tin (Sn), and an alloy (Sn—Ag) including tin. For example, the external connection terminal 170 may include a pillar portion connected to the internal wiring 112 and a solder portion below the pillar portion. The pillar portion may include at least one of copper (Cu) and nickel (Ni), and the solder portion may include an alloy (Sn—Ag) including tin.

In addition, the sawing process may be performed along the scribe line SL to cut the lower structure 110*p*, the encapsulant 150, and the upper structure 160*p*. The lower redistribution structure 110 and the upper redistribution structure 160 may be formed by the sawing process, which makes it possible to the semiconductor package 100 shown in FIG. 1. The lower redistribution structure 110 and the upper redistribution structure 160 may correspond to a portion of the lower structure 110*p* and a portion of the upper structure 160*p* in the package region R, respectively.

The present disclosure is not limited to the above-described embodiments and the accompanying drawings but is defined by the appended claims. Therefore, those of ordinary skill in the art may make various replacements, modifications, or changes without departing from the scope of the present disclosure defined by the appended claims, and these replacements, modifications, or changes should be construed as being included in the scope of the present disclosure.

What is claimed is:

1. A semiconductor package comprising:

a lower redistribution structure comprising an insulating layer, a connection pad and an upper pad, wherein the connection pad and the upper pad are disposed on an upper surface of the insulating layer;

a semiconductor chip mounted on the lower redistribution structure and connected to the upper pad;

a conductive post disposed on the connection pad;

at least one dummy post disposed on the lower redistribution structure; and an upper redistribution structure disposed on the semiconductor chip and connected to the conductive post, wherein a height of the at least one dummy post is less than a height of the conductive post, wherein the at least one dummy post is not electrically connected to the lower redistribution structure and the upper redistribution structure.

2. The semiconductor package of claim 1, wherein an upper surface of the at least one dummy post is disposed at a lower level than an upper surface of the conductive post.

3. The semiconductor package of claim 2, wherein a difference between the height of the at least one dummy post and the height of the conductive post is within a range of 10 μm to 15 μm.

4. The semiconductor package of claim 1, wherein a horizontal width of the at least one dummy post is greater than a horizontal width of the conductive post.

5. The semiconductor package of claim 4, wherein a difference between the horizontal width of the at least one dummy post and the horizontal width of the conductive post is within a range of 20 μm to 50 μm.

6. The semiconductor package of claim 1, wherein the at least one dummy post is disposed in a center region of the lower redistribution structure adjacent to the semiconductor chip.

7. The semiconductor package of claim 1, wherein a lower surface of the at least one dummy post is in direct contact with the insulating layer.

8. The semiconductor package of claim 1, wherein the at least one dummy post comprises a body portion disposed on an upper surface of the lower redistribution structure and a protrusion protruding downward from a lower surface of the body portion.

9. The semiconductor package of claim 8, wherein the protrusion is embedded in the insulating layer.

10. The semiconductor package of claim 1, wherein the at least one dummy post comprises a first dummy post and a second dummy post, and wherein a distance between the first dummy post and the semiconductor chip is less than a distance between the second dummy post and the semiconductor chip, and a height of the first dummy post is greater than a height of the second dummy post.

11. The semiconductor package of claim 10, wherein the lower redistribution structure further comprises a via disposed below the connection pad, the first dummy post comprises a first protrusion having a horizontal width greater than a horizontal width of the via, and the second dummy post comprises a second protrusion having a horizontal width greater than the horizontal width of the via.

12. The semiconductor package of claim 10, wherein the first dummy post comprises a first protrusion and the second dummy post comprises a second protrusion, and a horizontal width of the first protrusion is greater than a horizontal width of the second protrusion.

13. The semiconductor package of claim 1, wherein the at least one dummy post comprises a third dummy post, and the third dummy post comprises a plurality of protrusions.

14. The semiconductor package of claim 1, further comprising: an encapsulant disposed between the lower redistribution structure and the upper redistribution structure and configured to cover the semiconductor chip, wherein an upper surface of the conductive post is coplanar with an upper surface of the encapsulant, and an upper surface of the at least one dummy post is covered by the encapsulant.

15. A semiconductor package comprising:

a lower redistribution structure comprising an insulating layer, a connection pad and an upper pad, wherein the connection pad and the upper pad are disposed on an upper surface of the insulating layer;

a semiconductor chip mounted on the lower redistribution structure and connected to the upper pad;

a conductive post disposed on the connection pad;

at least one center dummy post disposed in a center region of the lower redistribution structure;

at least one edge dummy post disposed in an edge region of the lower redistribution structure; and an upper redistribution structure disposed on the semiconductor chip and connected to the conductive post, wherein a height of the at least one center dummy post is less than a height of the conductive post, and an upper surface of the at least one center dummy post is spaced apart from the upper redistribution structure.

16. The semiconductor package of claim 15, wherein horizontal widths of the at least one center dummy post and the at least one edge dummy post are greater than a horizontal width of the conductive post.

17. The semiconductor package of claim 15, wherein the at least one center dummy post is disposed to surround the semiconductor chip.

18. A semiconductor package comprising:

a lower redistribution structure comprising an insulating layer, a connection pad and an upper pad, wherein the connection pad and the upper pad are disposed on an upper surface of the insulating layer;

an external connection terminal disposed below the lower redistribution structure;

a semiconductor chip mounted on the lower redistribution structure and connected to the upper pad;

a conductive post disposed on the connection pad;

at least one dummy post disposed adjacent to the semiconductor chip on the lower redistribution structure;

an upper redistribution structure disposed on the semiconductor chip and connected to the conductive post; and an encapsulant disposed between the lower redistribution structure and the upper redistribution structure and configured to cover the semiconductor chip, wherein a height of the at least one dummy post is less than a height of the conductive post, an upper surface of the at least one dummy post is spaced apart from the upper redistribution structure, and a portion of the at least one dummy post is embedded in the insulating layer.

19. The semiconductor package of claim 18, wherein the upper surface of the at least one dummy post is covered by the encapsulant.

* * * * *